United States Patent
Lower et al.

(10) Patent No.: US 8,585,937 B2
(45) Date of Patent: Nov. 19, 2013

(54) GLASS THICK FILM EMBEDDED PASSIVE MATERIAL

(75) Inventors: Nathan P. Lower, North Liberty, IA (US); Ross K. Wilcoxon, Cedar Rapids, IA (US); Alan P. Boone, Swisher, IA (US); Nathaniel P. Wyckoff, Cedar Rapids, IA (US); Brandon C. Hamilton, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/359,105

(22) Filed: Jan. 26, 2012

(65) Prior Publication Data

US 2012/0118623 A1   May 17, 2012

Related U.S. Application Data

(62) Division of application No. 12/286,207, filed on Sep. 29, 2008, now Pat. No. 8,119,040.

(51) Int. Cl.
  *H01B 1/02* (2006.01)
  *H01B 1/06* (2006.01)

(52) U.S. Cl.
  USPC ............... 252/521.3; 252/518.1; 106/634; 118/300; 118/313; 174/260; 427/58; 427/376.2; 428/615

(58) Field of Classification Search
  USPC ............. 252/518.1, 521.3; 106/634; 118/313; 118/300; 427/58, 376.2; 428/615; 174/260
  See application file for complete search history.

(56) References Cited

U.S. PATENT DOCUMENTS

| | | |
|---|---|---|
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,513,029 A | 4/1985 | Sakai |
| 4,560,084 A | 12/1985 | Wolfson |
| 4,572,924 A | 2/1986 | Wakely et al. |

(Continued)

FOREIGN PATENT DOCUMENTS

| | | |
|---|---|---|
| JP | 55-120083 | 9/1980 |
| JP | 57-027942 A | 2/1982 |

(Continued)

OTHER PUBLICATIONS

U.S. Appl. No. 11/732,982, filed Apr. 5, 2007, Boone et al.

(Continued)

*Primary Examiner* — Khanh Tuan Nguyen
(74) *Attorney, Agent, or Firm* — Donna P. Suchy; Daniel M. Barbieri

(57) ABSTRACT

A method for forming an embedded passive device module comprises depositing a first amount of an alkali silicate material, co-depositing an amount of embedded passive device material with the amount of alkali silicate material; and thermally processing the amount of alkali silicate material and the amount of embedded passive device material at a temperature sufficient to cure the amount of alkali silicate material and the amount of embedded passive device material and form a substantially moisture free substrate.

11 Claims, 4 Drawing Sheets

(56) References Cited

U.S. PATENT DOCUMENTS

| | | |
|---|---|---|
| 4,622,433 A | 11/1986 | Frampton |
| 4,761,518 A | 8/1988 | Butt et al. |
| 4,765,948 A | 8/1988 | DeLuca et al. |
| 4,773,826 A | 9/1988 | Mole |
| 4,802,531 A | 2/1989 | Nathenson et al. |
| 4,882,212 A | 11/1989 | SinghDeo et al. |
| 4,963,503 A | 10/1990 | Aoki et al. |
| 5,041,342 A | 8/1991 | Umeda et al. |
| 5,136,365 A | 8/1992 | Pennisi et al. |
| 5,140,109 A | 8/1992 | Matsumoto et al. |
| 5,184,211 A | 2/1993 | Fox |
| 5,195,231 A | 3/1993 | Fanning et al. |
| 5,232,970 A | 8/1993 | Solc et al. |
| 5,244,726 A | 9/1993 | Laney et al. |
| 5,265,136 A | 11/1993 | Yamazaki et al. |
| 5,288,769 A | 2/1994 | Papageorge et al. |
| 5,315,155 A | 5/1994 | O'Donnelly et al. |
| 5,405,808 A | 4/1995 | Rostoker et al. |
| 5,502,889 A | 4/1996 | Casson et al. |
| 5,581,286 A | 12/1996 | Hayes et al. |
| 5,686,703 A | 11/1997 | Yamaguchi |
| 5,690,837 A | 11/1997 | Nakaso et al. |
| 5,702,963 A | 12/1997 | Vu et al. |
| 5,863,605 A | 1/1999 | Bak-Boychuk et al. |
| 5,916,944 A | 6/1999 | Camilletti et al. |
| 5,958,794 A | 9/1999 | Bruxvoort et al. |
| 5,965,947 A | 10/1999 | Nam et al. |
| 5,991,351 A | 11/1999 | Woolley |
| 6,010,956 A | 1/2000 | Takiguchi et al. |
| 6,019,165 A | 2/2000 | Batchelder |
| 6,021,844 A | 2/2000 | Batchelder |
| 6,027,791 A | 2/2000 | Higashi et al. |
| 6,028,619 A | 2/2000 | Saita et al. |
| 6,039,896 A | 3/2000 | Miyamoto et al. |
| 6,048,656 A | 4/2000 | Akram et al. |
| 6,087,018 A | 7/2000 | Uchiyama |
| 6,110,656 A | 8/2000 | Eichorst et al. |
| 6,121,175 A | 9/2000 | Drescher et al. |
| 6,124,224 A | 9/2000 | Sridharan et al. |
| 6,159,910 A | 12/2000 | Shimizu et al. |
| 6,356,334 B1 | 3/2002 | Mathew et al. |
| 6,370,015 B2 | 4/2002 | Noda et al. |
| 6,423,415 B1 | 7/2002 | Greene et al. |
| 6,451,283 B1 | 9/2002 | Kuznicki et al. |
| 6,452,090 B2 | 9/2002 | Takato et al. |
| 6,486,087 B1 | 11/2002 | Saling et al. |
| 6,496,359 B2 | 12/2002 | Clark et al. |
| 6,541,083 B1 | 4/2003 | Landa et al. |
| 6,541,832 B2 | 4/2003 | Coyle |
| 6,586,087 B2 | 7/2003 | Young |
| 6,599,643 B2 | 7/2003 | Heimann et al. |
| 6,617,041 B2 | 9/2003 | Hahn et al. |
| 6,624,276 B2 | 9/2003 | Lamers et al. |
| 6,658,861 B1 | 12/2003 | Ghoshal et al. |
| 6,663,793 B2 | 12/2003 | Parkhill et al. |
| 6,664,567 B2 | 12/2003 | Kyoda et al. |
| 6,665,186 B1 | 12/2003 | Calmidi et al. |
| 6,708,501 B1 | 3/2004 | Ghoshal et al. |
| 6,798,072 B2 | 9/2004 | Kajiwara et al. |
| 6,800,326 B1 | 10/2004 | Uchiyama |
| 6,800,330 B2 | 10/2004 | Hayashi et al. |
| 6,918,984 B2 | 7/2005 | Murray et al. |
| 6,960,878 B2 | 11/2005 | Sakano et al. |
| 6,986,859 B2 | 1/2006 | Mazany et al. |
| 7,045,905 B2 | 5/2006 | Nakashima |
| 7,078,263 B2 | 7/2006 | Dean |
| 7,114,251 B2 | 10/2006 | Mashino |
| 7,131,286 B2 | 11/2006 | Ghoshal et al. |
| 7,175,937 B2 | 2/2007 | Cho et al. |
| 7,176,564 B2 | 2/2007 | Kim |
| 7,202,598 B2 | 4/2007 | Juestel et al. |
| 7,265,977 B2 | 9/2007 | Martin et al. |
| 7,293,416 B2 | 11/2007 | Ghoshal |
| 7,296,417 B2 | 11/2007 | Ghoshal |
| 7,297,206 B2 * | 11/2007 | Naruse et al. ............... 106/634 |
| 7,307,286 B2 | 12/2007 | Ito et al. |
| 7,327,039 B2 | 2/2008 | Charles et al. |
| 7,340,904 B2 | 3/2008 | Sauciuc et al. |
| 7,342,787 B1 | 3/2008 | Bhatia |
| 7,348,665 B2 | 3/2008 | Sauciuc et al. |
| 7,365,984 B2 | 4/2008 | Jeong |
| 7,391,060 B2 | 6/2008 | Oshio |
| 7,441,087 B2 | 10/2008 | Hakura et al. |
| 7,473,460 B2 | 1/2009 | Meguro et al. |
| 7,476,981 B2 | 1/2009 | Bergmann et al. |
| 7,491,431 B2 | 2/2009 | Chiruvolu et al. |
| 7,497,961 B2 | 3/2009 | Keenan et al. |
| 7,651,556 B2 | 1/2010 | Komiyama et al. |
| 7,671,468 B2 | 3/2010 | Kanazawa et al. |
| 7,692,259 B2 | 4/2010 | Suehiro |
| 7,709,093 B2 | 5/2010 | Makowski et al. |
| 7,737,356 B2 | 6/2010 | Goldstein |
| 7,910,403 B2 | 3/2011 | Hirano et al. |
| 7,915,527 B1 | 3/2011 | Lower et al. |
| 8,017,872 B2 | 9/2011 | Cripe et al. |
| 8,076,185 B1 | 12/2011 | Lower et al. |
| 8,084,855 B2 | 12/2011 | Lower et al. |
| 8,119,040 B2 | 2/2012 | Lower et al. |
| 8,174,830 B2 | 5/2012 | Lower et al. |
| 2001/0015443 A1 | 8/2001 | Komoto |
| 2001/0030493 A1 | 10/2001 | Noda et al. |
| 2002/0054976 A1 | 5/2002 | Nakamura et al. |
| 2002/0076192 A1 | 6/2002 | Bartholomew et al. |
| 2002/0189894 A1 | 12/2002 | Davis et al. |
| 2003/0080341 A1 | 5/2003 | Sakano et al. |
| 2003/0228424 A1 | 12/2003 | Dove et al. |
| 2004/0116577 A1 * | 6/2004 | Naruse et al. ............... 524/442 |
| 2004/0156995 A1 * | 8/2004 | Komiyama et al. ........ 427/376.2 |
| 2004/0194667 A1 | 10/2004 | Reuscher |
| 2005/0099775 A1 | 5/2005 | Pokharna et al. |
| 2005/0116237 A1 | 6/2005 | Voutsas |
| 2006/0045755 A1 | 3/2006 | McDonald et al. |
| 2006/0068218 A1 | 3/2006 | Hooghan et al. |
| 2006/0113066 A1 | 6/2006 | Mongia et al. |
| 2006/0135342 A1 | 6/2006 | Anderson et al. |
| 2006/0250731 A1 | 11/2006 | Parkhurst et al. |
| 2006/0283546 A1 | 12/2006 | Tremel et al. |
| 2007/0102833 A1 | 5/2007 | Hack et al. |
| 2007/0108586 A1 | 5/2007 | Uematsu et al. |
| 2008/0006204 A1 | 1/2008 | Rusinko et al. |
| 2008/0050512 A1 * | 2/2008 | Lower et al. ............... 427/58 |
| 2008/0063875 A1 | 3/2008 | Robinson et al. |
| 2008/0142966 A1 | 6/2008 | Hirano et al. |
| 2008/0299300 A1 | 12/2008 | Wilcoxon et al. |
| 2009/0110904 A1 | 4/2009 | Mack et al. |
| 2009/0183774 A1 | 7/2009 | Atanackovic |
| 2009/0246355 A9 | 10/2009 | Lower et al. |
| 2010/0064518 A1 | 3/2010 | Lower et al. |
| 2010/0064695 A1 | 3/2010 | Wilcoxon et al. |
| 2010/0065256 A1 | 3/2010 | Wilcoxon et al. |
| 2010/0066178 A1 | 3/2010 | Lower et al. |

FOREIGN PATENT DOCUMENTS

| | | |
|---|---|---|
| JP | 60-013875 | 1/1985 |
| JP | 02-064071 | 3/1990 |
| JP | 11-095246 | 4/1994 |
| JP | 2003332505 A | 11/2003 |
| JP | 2006-045420 | 2/2006 |
| WO | WO 2006/095677 A1 | 9/2006 |

OTHER PUBLICATIONS

U.S. Appl. No. 11/959,225, filed Dec. 18, 2007, Lower et al.

Click et al., Schott Low Temperature Bonding for Precision Optics, http://optics.nasa.gov/tech_days/tech_days_2004/docs/18%20Aug%202004/23%20Schott%20Low%20Temperature%20Bonding.pdf, 20 pages.

Golubev et al., Modeling of Acid Base Properties of Binary Alkali-Silicate Melts, Rev. Adv. Mater. Sci. 6, http://www.ipme.ru/e-journals/RAMS/no_1604/golubev/golubev.pdf, 8 pages.

(56) References Cited

OTHER PUBLICATIONS

Kennedy, Strength and Fracture Toughness of Binary Alkali Silicate Glasses (Abstract only), http://www.oai.dtic.mil/oai/oai?verb=getRecord&metadataPrefix=html&identifier=ADA016820, Feb. 14, 1974, 1 page.
Lewis et al., Direct Writing in Three Dimension, Materialstoday, Jul./Aug. 2004, 8 pages.
Mysen et al., Properties and Structure (Developments in Geochemistry), Silicate Glasses and Melts, vol. 10, http://www.amazon.com/Silicate-Glasses-Melts-Developments-Geochemistry/dp/0444520112, 4 pages.
Nascimento et al., Universal Curve of Ionic Conductivities in Binary Alkali Silicate Glasses, http://www.springerlink.com/content/p7535075x1872016/, Journal of Materials Science (2005), 3 pages.
Optomec® Systems M3D® Breakthrough Technology for Printable Electronics, pp. 1-2.
Pedone et al., Insight into Elastic Properties of Binary Alkali Silicate Glasses; Prediction and Interpretation through Atomistic Simulation Techniques, http://pubs.acs.org/doi/abs/10.1021/cm062619r, Chemistry of Materials, 2007, 2 pages.
PQ Corporation, Bonding and Coating Applications of PQ® Soluble Silicates, Bulletin 12-31, (2003) 7 pages.
PQ Corporation, PQ® Soluble Silicates in Refractory and Chemical-Resistant Cements, Bulletin 24-1, (2003), 6 pages.
Shermer, Thermal Expansion of Binary Alkali Silicate Glasses, http://nvl.nist.gov/pub/nistpubs/jres/057/2/V57.N02.A05, Journal of Research of the National Bureau of Standards, Aug. 1956, Research Paper No. 2698, 5 pages.
Technical Standard Order, TSO-C115b, Airborne Area Navigation Equipment Using Multi-Sensor Inputs, Department of Transportation, Federal Aviation Administration, Sep. 30, 1994, 11 pages.
Techpowerup, NanoCoolers Puts Liquid Metal in Your PC, www.techpowerup.com/?3105, May 4, 2005, 19 pages.
The Mixed-Alkali Effect for the Viscosity of Glasses, http://glassproperties.com/viscosity/mixed-alkali-effect-viscosity/, 7 pages.
The Structure of Glasses, Alkali Silicate Glasses, www.ptc.tugraz.at/specmag/struct/ss.htm, retrieved on Dec. 3, 2010, 1 page.
Thresh, The Action of Natural Waters on Lead, The Analyst, Proceedings of the Society of Public Analysts and Other Analytical Chemists, Nov. 1922, 11 pages.
International Search Report and Written Opinion for Application No. PCT/US2009/031699, mail date Aug. 18, 2009, 16 pages.
International Search Report and Written Opinion for Application No. PCT/US2009/036355, mail date Jun. 30, 2009, 11 pages.
International Search Report and Written Opinion for International Application No. PCT/US2008/074224, mail date Jan. 30, 2009, 9 pages.
International Search Report and Written Opinion for International Application No. PCT/US2008/075591, mail date Apr. 8, 2009, 7 pages.
Amendment and Reply for U.S. Appl. No. 11/508,782, mail date Sep. 2, 2008, 10 pages.
Office Action for U.S. Appl. No. 11/508,782, mail date Dec. 24, 2008, 9 pages.
Amendment and Reply for U.S. Appl. No. 11/508,782, mail date Mar. 24, 2009, 10 pages.
Office Action for U.S. Appl. No. 11/508,782, mail date Jun. 16, 2009, 13 pages.
Amendment and Reply for U.S. Appl. No. 11/508,782, mail date Aug. 14, 2009, 12 pages.
Advisory Action for U.S. Appl. No. 11/508,782, mail date Aug. 31, 2009, 3 pages.
Response for U.S. Appl. No. 11/508,782, mail date Nov. 13, 2009, 14 pages.
Office Action for U.S. Appl. No. 11/508,782, mail date Feb. 24, 2010, 12 pages.
Amendment and Reply for U.S. Appl. No. 11/508,782, mail date Jun. 24, 2010, 10 pages.
Office Action for U.S. Appl. No. 11/508,782, mail date Sep. 2, 2010, 13 pages.
Amendment and Reply for U.S. Appl. No. 11/508,782, mail date Nov. 2, 2010, 12 pages.
Supplemental Amendment and Reply for U.S. Appl. No. 11/508,782, mail date Nov. 3, 2010, 3 pages.
Advisory Action and Examiner Interview Summary for U.S. Appl. No. 11/508,782, mail date Nov. 23, 2010, 5 pages.
Request for Continued Examination for U.S. Appl. No. 11,508,782, mail date Dec. 2, 2010, 10 pages.
Examiner Interview Summary for U.S. Appl. No. 11/508,782, mail date Jan. 5, 2011, 2 pages.
Office Action for U.S. Appl. No. 11/508,782, mail date Jan. 19, 2011, 9 pages.
Amendment and Reply for U.S. Appl. No. 11/508,782, mail date Apr. 5, 2011, 9 pages.
Notice of Allowance for U.S. Appl. No. 11/508,782, mail date May 31, 2011, 9 pages.
Notice of Allowance for U.S. Application No. 11/508,782, mail date Jul. 26, 2011, 4 pages.
Request for Continued Examination for U.S. Appl. No. 11/508,782, mail date Aug. 30, 2011, 6 pages.
Notice of Allowance for U.S. Appl. No. 11/508,782, mail date Sep. 20, 2011, 7 pages.
Restriction Requirement for U.S. Appl. No. 11/732,982, mail date Sep. 24, 2010, 5 pages.
Amendment and Reply for U.S. Appl. No. 11/732,982, mail date Oct. 25, 2010, 6 pages.
Office Action for U.S. Appl. No. 11/732,982, mail date Feb. 2, 2011, 15 pages.
Amendment and Reply for U.S. Appl. No. 11/732,982, mail date May 2, 2011, 12 pages.
Office Action for U.S. Appl. No. 11/732,982, mail date Jun. 21, 2011, 14 pages.
Request for Continued Examination for U.S. Appl. No. 11/732,982, mail date Aug. 22, 2011, 11 pages.
Office Action for U.S. Appl. No. 11/732,982, mail date Sep. 14, 2011, 13 pages.
Amendment and Reply for U.S. Appl. No. 11/732,982, mail date Jan. 13, 2012, 11 pages.
Office Action for U.S. Appl. No. 11/732,982, mail date Apr. 16, 2012, 15 pages.
Amendment and Reply for U.S. Appl. No. 11/732,982, mail date Jun. 14, 2012, 11 pages.
Office Action for U.S. Appl. No. 11/732,982, mail date Jul. 3, 2012, 15 pages.
Amendment and Reply for U.S. Appl. No. 11/732,982, mail date Sep. 28, 2012, 7 pages.
Notice of Allowance for U.S. Appl. No. 11/732,982, mail date Nov. 8, 2012, 8 pages.
Restriction Requirement for U.S. Appl. No. 11/959,225, mail date Jul. 22, 2009, 10 pages.
Amendment and Reply for U.S. Appl. No. 11/959,225, mail date Aug. 24, 2009, 2 pages.
Office Action for U.S. Appl. No. 11/959,225, mail date Dec. 2, 2009, 14 pages.
Amendment and Reply for U.S. Appl. No. 11/959,225, mail date Mar. 2, 2010, 9 pages.
Office Action for U.S. Appl. No. 11/959,225, mail date May 26, 2010, 16 pages.
Amendment and Reply for U.S. Appl. No. 11/959,225, mail date Aug. 26, 2010, 11 pages.
Office Action for U.S. Appl. No. 11/959,225, mail date Oct. 27, 2010, 11 pages.
Amendment and Reply for U.S. Appl. No. 11/959,225, mail date Jan. 27, 2011, 9 pages.
Office Action for U.S. Appl. No. 11/959,225, mail date Apr. 13, 2011, 16 pages.
Amendment and Reply for U.S. Appl. No. 11/959,225, mail date Jun. 13, 2011, 12 pages.
Amendment and Reply for U.S. Appl. No. 11/959,225, mail date Jul. 5, 2011, 6 pages.

(56) References Cited

OTHER PUBLICATIONS

Advisory Action for U.S. Appl. No. 11/959,225, mail date Jul. 5, 2011, 3 pages.
Office Action for U.S. Appl. No. 11/959,225, mail date Nov. 18, 2011, 16 pages.
Amendment and Reply for U.S. Appl. No. 11/959,225, mail date Feb. 15, 2012, 15 pages.
Office Action for U.S. Appl. No. 11/959,225, mail date Apr. 25, 2012, 17 pages.
Amendment and Reply for U.S. Appl. No. 11/959,225, mail date Jun. 25, 2012, 14 pages.
Advisory Action for U.S. Appl. No. 11/959,225, mail date Jul. 31, 2012, 3 pages.
Request for Continued Examination for U.S. Appl. No. 11/959,225, mail date Aug. 27, 2012, 19 pages.
Office Action for U.S. Appl. No. 11/959,225, mail date Sep. 25, 2012, 16 pages.
Office Action for U.S. Appl. No. 12/116,126, mail date Nov. 20, 2009, 7 pages.
Amendment and Reply for U.S. Appl. No. 12/116,126, mail date Feb. 22, 2010, 10 pages.
Office Action for U.S. Appl. No. 12/116,126, mail date Apr. 22, 2010, 7 pages.
Amendment and Reply for U.S. Appl. No. 12/116,126, mail date Jun. 22, 2010, 7 pages.
Advisory Action for U.S. Appl. No. 12/116,126, mail date Jun. 29, 2010, 4 pages.
Request for Continued Examination for U.S. Appl. No. 12/116,126, mail date Jul. 22, 2010, 4 pages.
Amendment and Reply for U.S. Appl. No. 12/116,126, mail date Jul. 22, 2010, 9 pages.
Office Action for U.S. Appl. No. 12/116,126, mail date Oct. 25, 2010, 8 pages.
Amendment and Reply for U.S. Appl. No. 12/116,126, mail date Jan. 25, 2011, 8 pages.
Office Action for U.S. Appl. No. 12/116,126, mail date Feb. 25, 2011, 9 pages.
Request for Continued Examination for U.S. Appl. No. 12/116,126, mail date Apr. 29, 2011, 4 pages.
Amendment and Reply for U.S. Appl. No. 12/116,126, mail date Apr. 29, 2011, 9 pages.
Office Action for U.S. Appl. No. 12/116,126, mail date May 10, 2011, 8 pages.
Amendment and Reply for U.S. Appl. No. 12/116,126, mail date Aug. 10, 2011, 11 pages.
Office Action for U.S. Appl. No. 12/116,126, mail date Sep. 12, 2011, 11 pages.
Amendment and Reply for U.S. Appl. No. 12/116,126, mail date Dec. 12, 2011, 10 pages.
Notice of Allowance for U.S. Appl. No. 12/116,126, mail date Jan. 5, 2012, 10 pages.
Office Action for U.S. Appl. No. 12/240,775, mail date May 26, 2011, 9 pages.
Amendment and Reply for U.S. Appl. No. 12/240,775, mail date Sep. 26, 2011, 11 pages.
Restriction Requirement for U.S. Appl. No. 12/240,775, mail date Jan. 12, 2012, 5 pages.
Office Action for U.S. Appl. No. 12/240,775, mail date Apr. 2, 2012, 8 pages.
Amendment and Reply for U.S. Appl. No. 12/240,775, mail date Jul. 2, 2012, 12 pages.
Office Action for U.S. Appl. No. 12/240,775, mail date Sep. 6, 2012, 9 pages.
Amendment and Reply for U.S. Appl. No. 12/240,775, mail date Nov. 6, 2012, 8 pages.
Advisory Action for U.S. Appl. No. 12/240,775, mail date Nov. 14, 2012, 2 pages.
Office Action for U.S. Appl. No. 11/732,981, mail date Oct. 6, 2010, 9 pages.
Amendment and Reply for U.S. Appl. No. 11/732,981, mail date Jan. 6, 2011, 9 pages.
Office Action for U.S. Appl. No. 11/732,981, mail date Mar. 16, 2011, 7 pages.
Request for Continued Examination for U.S. Appl. No. 11/732,981, mail date May 16, 2011, 12 pages.
Terminal Disclaimer for U.S. Appl. No. 11/732,981, mail date May 16, 2011, 1 page.
Terminal Disclaimer Decision for U.S. Appl. No. 11/732,981, mail date Jul. 11, 2011, 1 page.
Notice of Allowance for U.S. Appl. No. 11/732,981, mail date Jul. 26, 2011, 7 pages.
Request for Continued Examination for U.S. Appl. No. 11/732,981, mail date Oct. 25, 2011, 4 pages.
Office Action for U.S. Appl. No. 11/784,158, mail date Apr. 21, 2009, 10 pages.
Amendment and Reply for U.S. Appl. No. 11/784,158, mail date Jul. 21, 2009, 10 pages.
Office Action for U.S. Appl. No. 11/784,158, mail date Oct. 8, 2009, 7 pages.
Amendment and Reply for U.S. Appl. No. 11/784,158, mail date Jan. 8, 2010, 10 pages.
Office Action for U.S. Appl. No. 11/784,158, mail date Mar. 26, 2010, 7 pages.
Amendment and Reply for U.S. Appl. No. 11/784,158, mail date May 26, 2010, 12 pages.
Terminal Disclaimer for U.S. Appl. No. 11/784,158, mail date May 26, 2010, 1 page.
Terminal Disclaimer Decision for U.S. Appl. No. 11/784,158, mail date Jun. 8, 2010, 1 page.
Office Action for U.S. Appl. No. 11/784,158, mail date Jun. 17, 2010, 6 pages.
Notice of Allowance for U.S. Appl. No. 11/784,158, mail date Nov. 29, 2010, 4 pages.
Office Action for U.S. Appl. No. 11/784,932, mail date Apr. 3, 2009, 8 pages.
Amendment and Reply for U.S. Appl. No. 11/784,932, mail date Jul. 2, 2009, 8 pages.
Office Action for U.S. Appl. No. 11/784,932, mail date Feb. 16, 2010, 10 pages.
Request for Continued Examination for U.S. Appl. No. 11/784,932, mail date Jun. 14, 2010, 4 pages.
Amendment and Reply for U.S. Appl. No. 11/784,932, mail date Jun. 14, 2010, 9 pages.
Office Action for U.S. Appl. No. 11/784,932, mail date Nov. 10, 2010, 9 pages.
Notice of Allowance for U.S. Appl. No. 11/784,932, mail date May 12, 2011, 6 pages.
Request for Continued Examination for U.S. Appl. No. 11/784,932, mail date Aug. 10, 2011, 6 pages.
Notice of Allowance for U.S. Appl. No. 11/784,932, mail date Aug. 23, 2011, 8 pages.
Office Action for U.S. Appl. No. 12/284,670, mail date Feb. 17, 2011, 12 pages.
Office Action for U.S. Appl. No. 12/284,670, mail date Sep. 28, 2010, 10 pages.
Notice of Allowance for U.S. Appl. No. 12/284,670, mail date May 11, 2011, 7 pages.
Amendment and Reply for U.S. Appl. No. 12/284,670, mail date Apr. 18, 2011, 9 pages.
Office Action for U.S. Appl. No. 12/286,207, mail date Dec. 27, 2010, 14 pages.
Amendment and Reply for U.S. Appl. No. 12/286,207, mail date Mar. 28, 2011, 12 pages.
Notice of Allowance for U.S. Appl. No. 12/286,207, mail date Jun. 27, 2011, 12 pages.
Request for Continued Examination for U.S. Appl. No. 12/286,207, mail date Sep. 26, 2011, 4 pages.
Notice of Allowance for U.S. Appl. No. 12/286,207, mail date Oct. 6, 2011, 8 pages.
Restriction Requirement for U.S. Appl. No. 12/493,022, mail date Feb. 22, 2012, 6 pages.

(56) References Cited

OTHER PUBLICATIONS

Amendment and Reply for U.S. Appl. No. 12/493,022, mail date Mar. 23, 2012, 3 pages.

Office Action for U.S. Appl. No. 12/493,022, mail date May 30, 2012, 13 pages.

Amendment and Reply for U.S. Appl. No. 12/493,022, mail date Aug. 28, 2012, 7 pages.

Notice of Allowance for U.S. Appl. No. 12/493,022, mail date Sep. 20, 2012, 5 pages.

Office Action for U.S. Appl. No. 11/959,225, mail date Apr. 23, 2013, 6 pages.

Notice of Allowance for U.S. Appl. No. 11/732,982, mail date Dec. 19, 2012, 2 pages.

Notice of Allowance for U.S. Appl. No. 11/732,981, mail date Dec. 29, 2011, 7 pages.

Restriction Requirement for U.S. Appl. No. 13/329,068, mail date Jan. 15, 2013, 5 pages.

Office Action for U.S. Appl. No. 13/287,734, mail date Apr. 11, 2013, 18 pages.

\* cited by examiner

400 ⇘

---

402
depositing a first amount of alkali silicate material

404
co-depositing an amount of embedded passive device material with the amount of alkali silicate material

406
thermally processing the amount of alkali silicate material and the amount of embedded passive device material at a temperature sufficient to cure the amount of alkali silicate material and the amount of embedded passive device material and form a substantially moisture free substrate

408
applying a second amount of alkali silicate material substantially onto the substrate

410
co-depositing a second amount of embedded passive device material with the second amount of alkali silicate material substantially onto the substrate to form a second layer

FIG. 4

GLASS THICK FILM EMBEDDED PASSIVE MATERIAL

CROSS-REFERENCE TO RELATED APPLICATION

This application is a divisional of U.S. application Ser. No. 12/286,207 filed Sep. 29, 2008, which is hereby incorporated by reference in its entirety.

FIELD

The present invention relates generally to electronic substrates and more particularly to an electronic substrate containing embedded passives.

BACKGROUND

Recently, electronic technologies are moving toward the embedding of passives into a substrate so as to cope with demand for miniaturization and sophisticated functions of electronic goods according to advances in the electronics industry. Embedded passives are components, such as resistors, capacitors, inductors or the like, which are integrated or formed during the build up process of a printed circuit board (PCB) or other electronic substrate. These components may be embedded within one or more layers of a finished substrate, reducing the need to place and solder the passives during final board assembly.

SUMMARY

Accordingly, a glass thick film embedded passive device module includes, but is not limited to, an amount of an alkali silicate composition, and an amount of nano- or micro-particle composition co-deposited with the amount of alkali silicate composition, the amount of alkali silicate composition and the amount of nano- or micro-particle composition being co-deposited and thermally cured to form a substantially moisture free substrate.

Accordingly, a device for forming a glass thick film embedded material includes, but is not limited to, a deposit head for depositing an alkali silicate material and a nano- or micro-particle composition onto a substrate, the deposit head further including a plurality of depositors disposed substantially within in the deposit head; and a drive unit coupled to the plurality of depositors, the drive unit further including one or more drive elements for depositing a nano- or micro-particle composition loaded droplet or an alkali silicate material loaded droplet onto a substrate; a deposit head controller for controlling the driving of the drive elements, the deposit head controller further including at least one control element electrically coupled to at least one drive element; and a supply containing a plurality of the nano- or micro-particle composition loaded droplet or the alkali silicate material loaded droplet.

Accordingly, a method for forming a glass thick film embedded material includes, but not limited to, depositing an amount of alkali silicate material, co-depositing an amount of embedded passive device material with the amount of alkali silicate material to the surface, and thermally processing the amount of alkali silicate material and the amount of embedded passive device material at a temperature sufficient to cure the amount of alkali silicate material and the amount of embedded passive device material and form a substantially moisture free substrate.

In one or more various aspects, related devices and systems include but are not limited to circuitry and/or programming for effecting the herein referenced method aspects; the circuitry and/or programming can be virtually any combination of hardware, software, and/or firmware configured to effect the herein referenced method aspects depending upon the design choices of the system designer.

It is to be understood that both the foregoing general description and the following detailed description are exemplary and explanatory only and are not restrictive of the invention claimed. In addition to the illustrative aspects, embodiments, and features described above, further aspects, embodiments, and features will become apparent by reference to the drawings and the following detailed description.

BRIEF DESCRIPTION OF THE DRAWINGS

The numerous objects and advantages of the present invention may be better understood by those skilled in the art by reference to the accompanying figures in which:

FIG. 4 is a flow chart illustrating a method of forming a glass thick film embedded passive device module.

DETAILED DESCRIPTION

Figure 1:
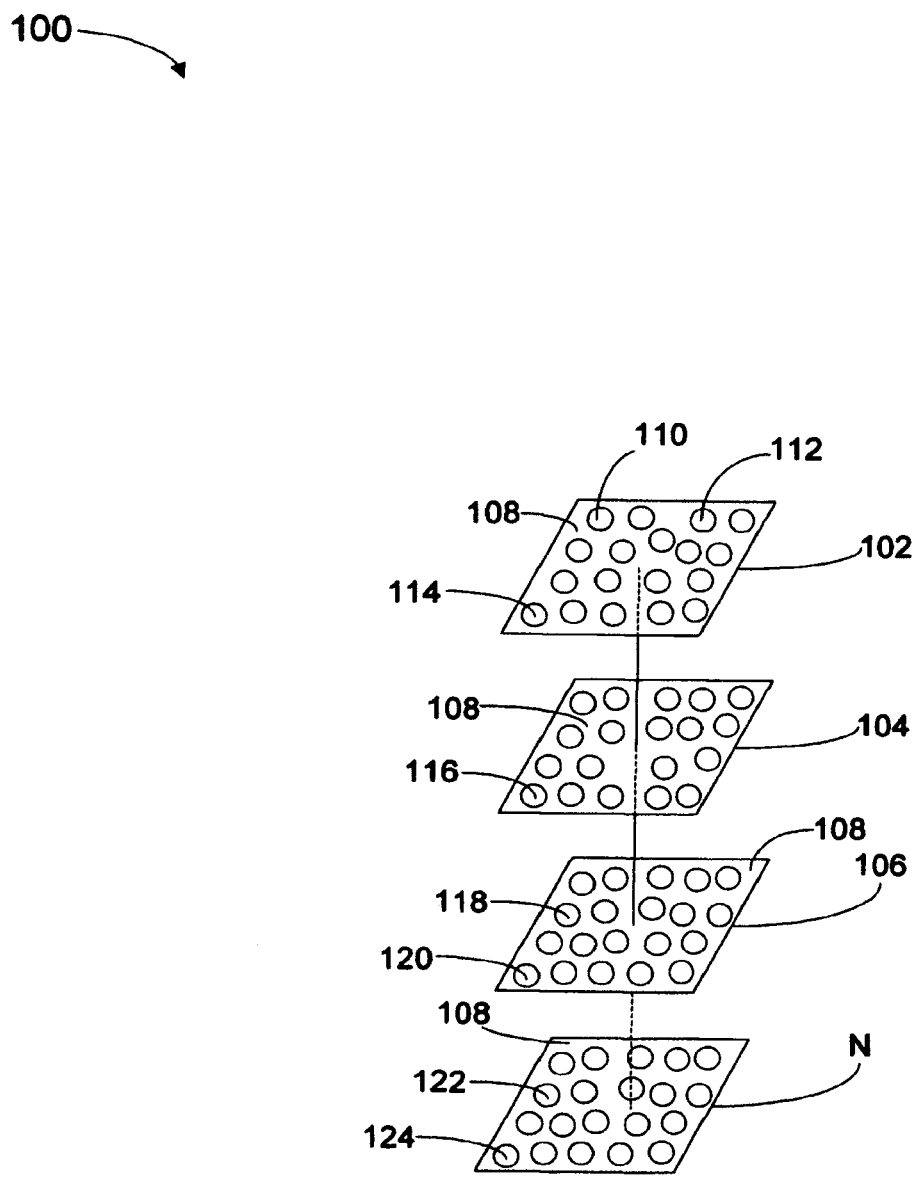
FIG. 1 is a block diagram illustrating a glass thick film embedded passive device module.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Referring to FIG. 1, a glass thick film embedded passive device module 100, in accordance with an exemplary embodiment of the present invention, is illustrated. The glass thick film embedded passive device module 100 includes at least a first layer 102 including a first co-deposition of an amount of an alkali silicate composition 108 and an amount of a nano- or micro-particle composition 110. The first co-deposition of an amount of an alkali silicate composition 108 and an amount of a nano- or micro-particle composition 110 may be thermally cured to form a substantially moisture free substrate. In further embodiments, a glass thick film embedded passive device module may include a second layer 104 applied substantially onto the first layer 102 including a second co-deposition of the alkali silicate material 108 and at least one particle and/or nano- or micro-particle composition 110-124. At least one of the first layer 102 and/or the second layer 104 may be thermally cured to form a multi-layer substantially moisture free substrate.

It is contemplated that a third layer 106 may be formed substantially on the second layer 104 and so on as necessary. It is to be noted that an embedded passive device module 100 according to the present disclosure may include tens, hundreds, or thousands of embedded passive device module layers bonded to one another, to a layer of alkali silicate material, to a metallization layer, a laminate layer, etc., to form one or more substrates or portions of a substrate including at least one embedded passive device, structure, and/or component.

For instance, an embedded passive device may include one or more electrical contacts. For resistors and capacitors, the electrical contacts may sandwich the alkali silicate material. For inductors, the alkali silicate material may be deposited on top of a metalized coil structure. It is further contemplated that any combination of alkali silicate material, alkali silicate material including embedded passive device material, metallization layers and/or laminate layers may be formed. Thus a glass thick film embedded passive device module 100 may include N layers as desired or necessary for embedded passive device and/or electronic substrate functionality. Individual layers, or total number of layers may be on the order of about a submicron to tens or hundreds of microns thick. Particle and/or nano- or micro-particle composition 110-124 may be any combination of particles and/or nano- or micro-particles, including a nano- or micro-particle composition forming at least a portion of an embedded passive device (e.g., embedded resistor, embedded capacitor, and/or embedded inductor).

The components (e.g., alkali silicate composition, a nano- or micro-particle composition and/or a particle composition) of the first through N layers may be applied via a deposit device (e.g., micro-piezo applicator). In additional embodiments, the components of the first through N layers may be co-deposited via a print head (e.g., micropiezo print head), a microspray head (e.g., a co-axial spray device), an ultra-fine spray deposition mechanism, an ultrasonic deposition mechanism, or any other suitable deposition or co-deposition mechanism. Embedded passive device module 100 may be applied over and/or between at least one interconnect layer of a printed circuit board or other electronic substrate. For instance, at least one of first layer 102, the second layer 104, the third layer 106 and so on may be applied over an insulating layer of an electronic substrate. At least one of first layer 102, the second layer 104, the third layer 106 and so on may be applied over a conducting layer of an electronic substrate. In additional embodiments, one or more interconnect layers may also be formed from the alkali silicate composite material.

The thickness of an embedded passive device module layer 102, 104, 106 . . . N is not specifically limited, and may be suitably selected from within a thickness range which is generally applied in this technical field or desirable for the electronic substrate configuration. Furthermore, the thickness of a plurality of bonded embedded passive device module layers, or an embedded passive device module layer bonded to an alkali silicate layer, a conductive layer, a dielectric layer, etc. may be determined by technical specifications or other requirements.

The first layer 102, second layer 104, the third layer 106, and so on, of the glass thick film embedded passive device module 100 may comprise a thin layer of alkali silicate material as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The glass thick film embedded passive device module 100 may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material with a $SiO_2/M_2O$ ratio (in which $M_2O$ is an alkali oxide, e.g. any $M^+$ ion) of greater than or equal to about 2.5. The material may be an alkali silicate material with a $SiO_2/M_2O$ ratio of greater than or equal to about 4. The material may be an alkali silicate/water solution. The material may be an alkali silicate material with nano- or micro-particle modifiers including, but not limited to, nano calcium carbonate, nano zinc oxide, and/or nano silicon dioxide. The material may be cured to produce the first through N layers at low temperatures of typically no more than about 160 degrees Celsius. The material may cure into a glass. Further, the alkali silicate material may be optically transparent and contain properties such as high transmission efficiency (e.g., greater than 90%), including interface reflection and low absorption loss. In additional embodiments, the alkali silicate material may be doped with metal ions to provide coloring or light filtering, as may be desirable for optical applications.

As stated previously, layers 102-N may be cured to form a substantially moisture free bond between the layers 102-N. Specifically, subsequent to curing, the layers 102-N of the glass thick film embedded passive device module 100 may be intimately bonded (tightly adhered) to one another and to one or more layers of an electronic substrate, and may be watertight with respect to one another and with one or more layers of an electronic substrate. The layers 102-N may be stable from about negative two-hundred forty-three degrees Celsius to at least about seven-hundred twenty-seven degrees Celsius.

As indicated, at least one of the glass thick film embedded passive device modules 100 may include a plurality of embedded passive devices or structures, or embedded passive device or structure components. The term "passive device" is hereinafter understood to describe an elemental resistor, capacitor, or inductor. In one embodiment, embedded passive devices may include resistive devices (e.g., resistors), inductive devices (e.g., inductors), and/or capacitive devices (e.g., capacitors). Embedded passive devices, structures or components may be co-deposited with the alkali silicate material as nano- or micro-structures or nano- or micro-particles. Co-deposited nano- or micro-particles may be in the form of a low-temperature nano- or micro-particle solution or suspension. For instance, the co-deposited nano- or micro-particles may be a flowable precursor including fine and/or ultra-fine particles (e.g. metal particles), with particle dimensions ranging from 10 nm to several hundred nm, and additional chemical additives (such as wetting agents or surfactants) that may be utilized to screen print or inkjet high quality metallization layers with low conversion temperatures in the range or 100 degrees C. to 350 degrees C. At least one of the first layer 102, the second layer, 104, the third layer 106 and so on may include a nano- or micro-particle suspension that is at least 60% by weight.

Figure 2:
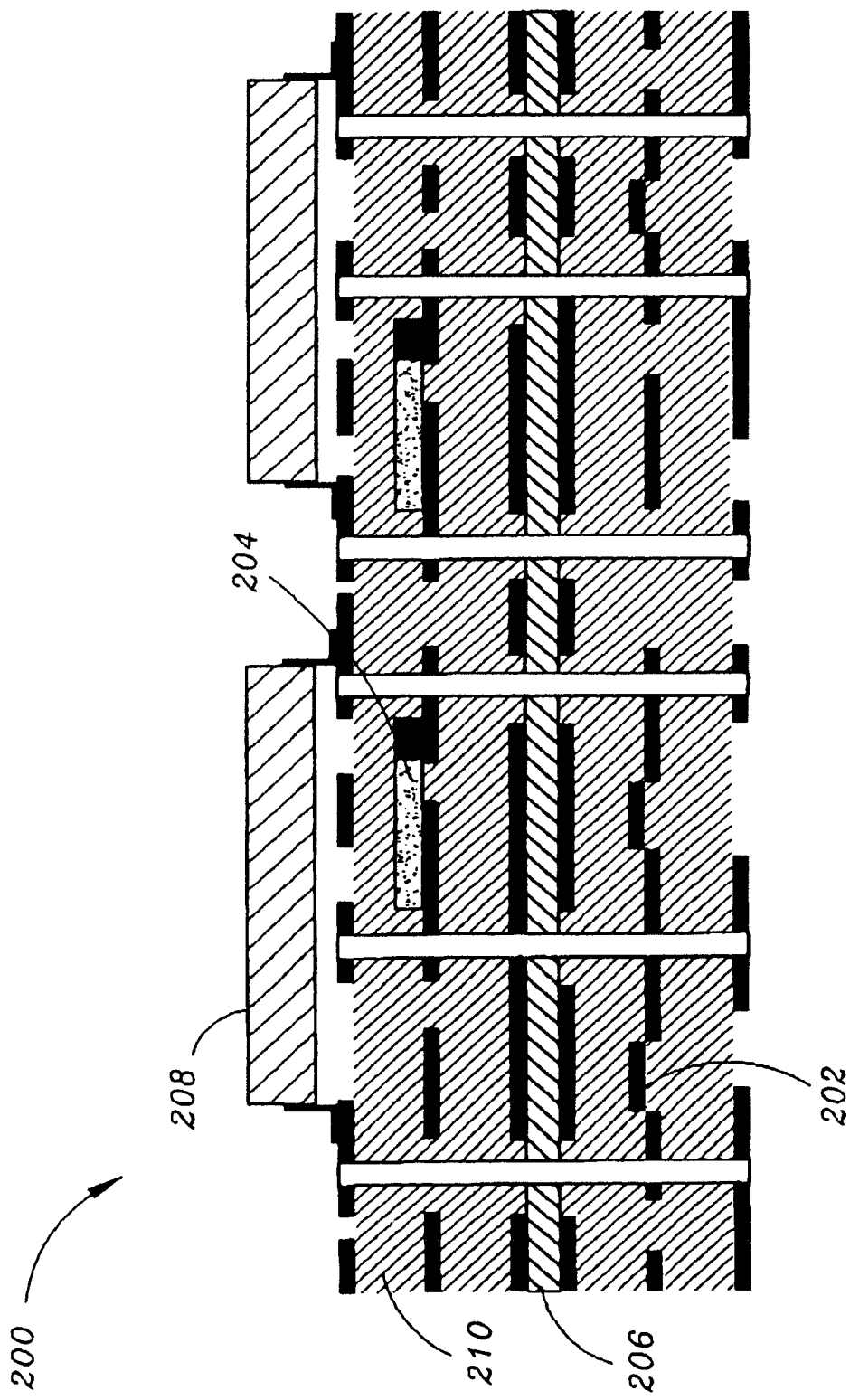
FIG. 2 is a cross-sectional view of an example of a circuit board including embedded passive device modules.

Referring to FIG. 2, a cross-sectional view of a circuit board 200 including one or more embedded passive device modules according to an embodiment of the disclosure is shown. Circuit board 200 or other electronic substrate may include embedded resistors 202, and/or embedded capacitors 204. Circuit board 200 may also include an amount of embedded passive material 206, a surface mounted chip 208 and/or an amount of inner core material 210.

Embedded resistors 202 may be formed, for example, from nano- or micro-silver, graphite, copper, tungsten, or other nano- or micro-particles, and/or any other resistive metal. Resistive structures may be composed of thick film resistor formulations formulated to cover a broad range of bulk resistivities. Resistive structures may be formed from one or more layers of resistive material co-deposited with an alkali silicate layer. The resistor may be deposited (e.g., via a micro-piezo depositor) directly on to pre-patterned terminations on the circuit board core and cured at temperatures in the order of 150° C. In some instances, a resistor paste may be co-deposited with the alkali silicate glass material applied to a conductive substrate layer in the sizes and locations for which the circuit design calls.

Embedded capacitors 204 may be formed, for example, from a nano- or micro-metal, ferroelectric nano- or micro-particles, paraelectric nano- or micro-particles, etc. embedded capacitors have been developed to address the need for having a small capacitor, and reducing or eliminating the need to solder passive devices onto the substrate (saving processing time and cost). The term "ferroelectric" may refer to a state of spontaneous polarization generated by the collective displacement of ions within the lattice of certain ionic crystals that produces a state of internal electrical polarization without the application of an external electric field. Ferroelectric materials are characterized by a transition-temperature, known as the Curie transition-temperature, below which the ionic crystal displays paraelectric behavior. Semi-conductive ferroelectrics may be obtained either by thermally treating ferroelectrics or by adding a doping additive to the surface of ferroelectrics followed by thermal treatment. Examples of the ferroelectrics which can be used in the present invention include lead (Pb)-based ferroelectrics, such as $BaTiO_3$, $PbTiO_3$, PMN—PT, $SrTiO_3$, $CaTiO_3$, and $MgTiO_3$. Such ferroelectrics may be used alone or in a mixture of two or more.

The term "paraelectric" may refer to a condition in which a material does not possess internal electrical polarization in the absence of electrical fields. A paraelectric material may be any material that may become polarized under an applied electric field. Paraelectrics (e.g., tantalum pentoxide) may be crystal phase materials in which electric dipoles are unaligned (i.e. unordered domains that are electrically charged) and thus have the potential to align in an external electric field and strengthen it.

In one embodiment, at least one embedded capacitor may be a two-layer embedded capacitor comprising a conductive layer (e.g., a metal-filled alkali silicate composite layer or a metal layer within the substrate) and a dielectric layer composed of co-deposited nano- or micro-metals and alkali silicate composite, or a conductive alkali silicate composite layer and a dielectric alkali silicate composite layer which are sequentially deposited. Nano- or micro-particles forming an embedded capacitor may be in the form of a dielectric powder (including capacitive nano- or micro-particles, e.g., barium titanate and/or tantalum pentoxide) dispersed in a layer of glass thick film (e.g., alkali silicate material). Capacitive structure powder and glass thick film material may be co-deposited over one or more electrodes pre-patterned on a circuit board, then cured at a relatively low temperature, on the order of less than 150 degrees Celsius. A glass thick film electrode layer (e.g., containing nano- or micro-silver as the conductive phase) may be applied on the previously applied dielectric layer to form a second electrode layer. Embedded capacitor structures may be positioned underneath a supported active component. For instance, an embedded capacitor dielectric placed between a power source and a ground plane may lower noise and provide capacitors for filter applications. It is contemplated that embedded capacitance devices of the present disclosure may provide a capacitance density on the order of 0.5 to over 200 $nF/in^2$. Capacitance values in the picofarad range are also possible on the low end. Additionally, a multi-layer embedded capacitor may have the potential of even greater capacitance values.

Circuit board 200 may also include one or more embedded passive inductors (not shown). Embedded passive inductors may be high value inductive structures formed, for example, from iron, nickel or cobalt (Fe, Ni, Co) nano- or micro-particles. A well known structure for an embedded inductor is a spiral-shaped inductor embedded in a magnetically permeable material. Spiral shaped inductors may be embedded between an electronic substrate or other pre-fabricated materials, permalloy loaded epoxies, or the like. A spiral inductor may be formed by depositing and patterning a layer of conductive alkali silicate material (e.g., a silver loaded alkali silicate, a patterned metal layer in a laminate substrate, etc.). After the formation of the spiral inductor, a second layer of magnetically permeable alkali silicate material may be formed on the top surface of the spiral pattern, and subsequently cured at a suitable temperature.

As shown in FIG. 2, one or more embedded passive device modules 100 may then be combined with one or more additional signal routing layers, including a capacitive inner layer 206, copper signal trace, core material (e.g., alkali silicate core material, FR-4 core material) into a stacked multilayer structure. Signal routing layers may contain vias and metallization used to conduct signals within, for example, a dielectric material. This electrical network may be utilized to maintain electrical communication between at least one embedded passive device module and a semiconductor device through conductive material in electrical contact with a surface metallization layer, or an external device through an electrical contact located on the periphery of the stacked multilayer structure.

Both conductive and functional layers may be formed from the co-deposition of the alkali silicate material and the nano- or micro-particle composition, having dielectric properties, insulating properties, magnetic properties and adhesion strength as necessary. Further, it is contemplated that standard conductive inks or epoxies (polymer based) may be utilized to form an embedded passive device or device portion. Additionally, plating may be used as a metal connection or routing, where a conductive pad or lead could be plated to a conductive ASG (as used for a resistor). Standard PC board processing may be utilized in any stage of the laminate build-up process. It is also contemplated that one or more embedded passive device modules may be applied to pre-formed conductive and functional layers. For instance, a layer of alkali silicate material may be adhered to the top of a layer of an electronic substrate. A layer of alkali silicate material may be formed below a layer of the electronic substrate. The layers may then be connected to the respective embedded passive device through respective vias and patterned to form connectors for the embedded passive device (e.g., patterned to form top and bottom connection pads for an embedded inductor). Additional electronic substrate layers may be added to one or more embedded passive device module layers, including layers containing signal tracks, power planes, additional embedded resistors, inductors, or capacitors, or active components such as field effect transistors and integrated circuits. The resulting assembly may, therefore, form the basis of a totally packaged circuit module.

Figure 3:
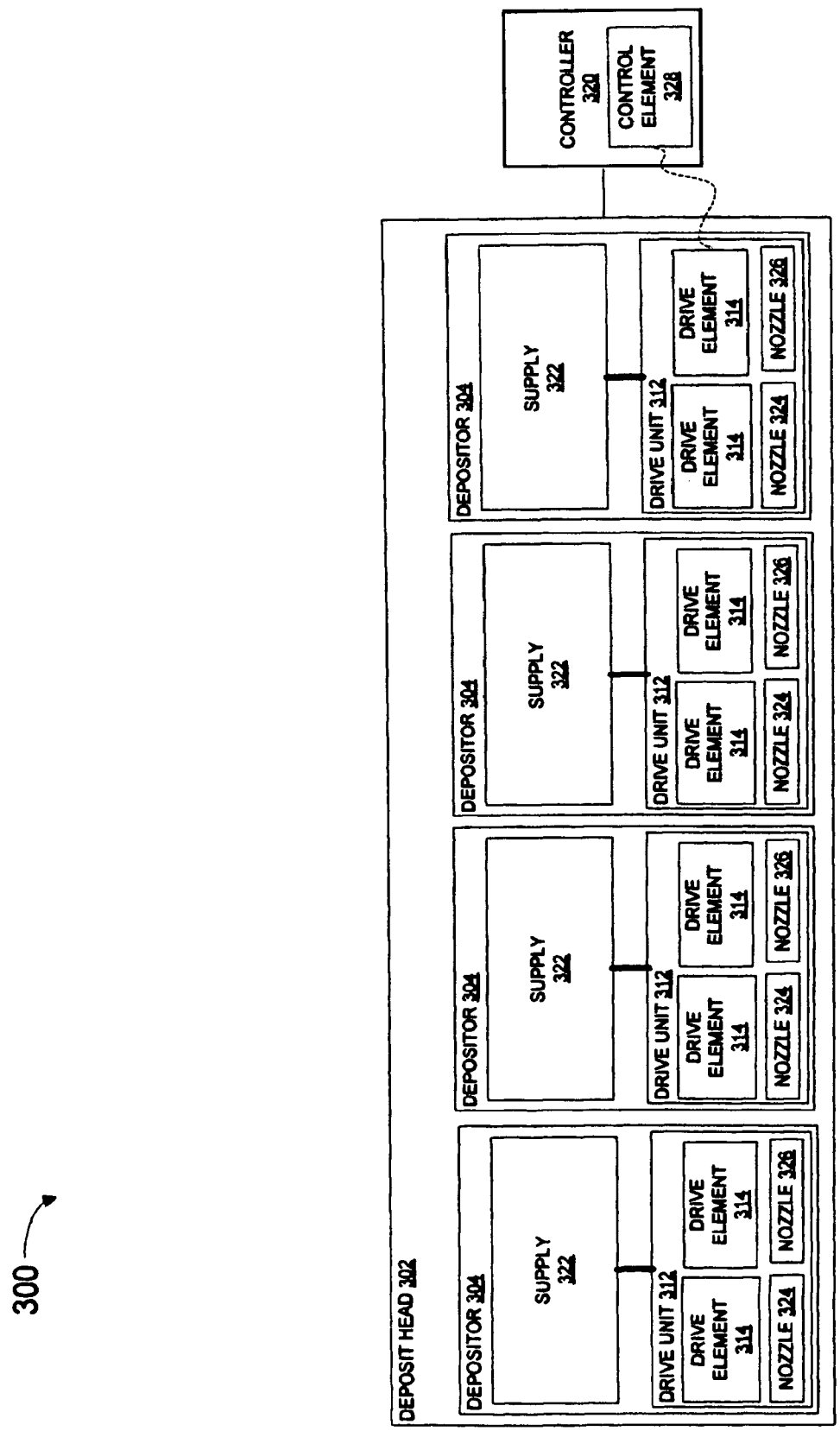
FIG. 3 is a block diagram illustrating a deposit device according to an embodiment of the disclosure.

As discussed above, a deposit device may be utilized to deposit or co-deposit at least one of the alkali silicate composite or a particle or nano- or micro-particle composite onto a substrate. Referring to FIG. 3, a block diagram of an example of a deposit device 300 that may be utilized to deposit or co-deposit at least one of the alkali silicate composite or a particle or nano- or micro-particle composite onto a substrate is shown. Deposit device 300 may include a deposit head 302 for ejecting particle or alkali silicate loaded droplets. Deposit device head 302 may also include a plurality of depositors (e.g., nozzles or nozzle groups) 304-310 may be provided in the deposit head. In one embodiment, a depositor may be a micro-piezo depositor including a plurality of micro-piezo deposit structures configured to deposit differing amounts of alkali silicate material and/or particle or nano- or micro-particle composites according to a desired circuit board or electronic substrate structure. In one specific embodiment, one or more nozzle groups may be formed within the deposit head 302. For instance, a first depositor 304, a second depositor 306, a third depositor 308, and a fourth depositor 310 may be formed in the lower surface of the deposit head 302. It is contemplated that deposit device 300 may include any number of depositors or nozzles as necessary, desired, or achievable based on design constraints. Each of the first depositor 304, the second depositor 306, the third depositor 308, and the fourth depositor 310 may include a plurality of nozzles 324-326 that are ejection openings for ejecting the droplets of each group. A nozzle 324-326 may also include a droplet chamber (not shown). Each of the plurality of nozzles 324-326 may contain an amount of alkali silicate material or a nano- or micro-particle composition. At least one nozzle may contain a combination of an alkali silicate material and a nano- or micro-particle composition, however, a nano- or micro-particle composition that may not be suspended in alkali silicate material for a great length of time (due, for example, to chemical interactions or particle agglomeration) may be stored and deposited from a dedicated nozzle separate from a nozzle including the alkali silicate material.

Deposit device 300 may include a drive unit 312 further including one or more drive elements 314, 316 such as a micro-piezo element or a piezo element or a heater. Drive elements 314, 316 may be provided for each nozzle 324-326 in order to effect the ejection of a droplet from the nozzle 324-326. Driving the drive elements 314, 316 (e.g., micro-piezo element) may cause the droplet chamber to expand and contract, thereby ejecting a droplet from the nozzle. A micro-piezo or piezo element may refer to a print element using a piezoelectric crystal (e.g., quartz) that rapidly flexes when current is applied, and forces droplets of material through a nozzle. The deposit head 302 may also include a deposit head controller 318 for controlling the driving of the drive elements. Controller 318 may include a control element 328 electrically coupled to an individual micro-piezo deposit structure to control the deposit of an amount of alkali silicate material or nano- or micro-particle composite material. A plurality of types of droplets in differing amounts and/or sizes may be deposited by the various depositors (e.g., nozzles or nozzle groups). Thus, deposits of different sizes, shapes, or amounts may be formed on the printed circuit board.

Deposit device 300 may further include any number of structural elements suitable for providing co-deposition of alkali silicate composite material, particle composite material and/or nano- or micro-particle composite material. Structural elements may include a platform coupled to the one or more depositors 304-310 to provide stability and stopping for the drive elements 314, 316 when, for example, a drive element contacts a substantially rigid surface, and/or a power supply line providing power to the deposit device 300.

In one embodiment, the deposit device 300 may include a supply 322 further including a plurality of pressure chambers and cavities (e.g., reservoirs) for loading nano- or micro-particle loaded or alkali silicate material loaded droplets. Supply openings may be formed, corresponding to the drive elements 314, 316 (e.g., micro-piezo deposit structure). For instance, each depositor 304-310 of the deposit device supply 322 may include a reservoir for storing the nano- or micro-particle loaded or alkali silicate material loaded droplets. Supply 322 may provide the stored particle loaded, nano- or micro-particle loaded and/or alkali silicate material loaded droplets to a pressure chamber. The particle loaded, nano- or micro-particle loaded and/or alkali silicate material loaded droplet from the supply 322 may be introduced to the drive element 314, 316 through a particle loaded or alkali silicate material loaded droplet supply tube. A drive signal may be supplied to a drive element 314, 316 (e.g., a micro-piezo element) from the controller 320. The drive element 314, 316 may expand and contract, increasing and decreasing the volume of the pressure chamber and thus, the pressure of the deposit material in the pressure chamber in response to the drive signal. In this way, the change in droplet pressure may be utilized to cause a droplet to be ejected from the nozzle.

Referring to FIG. 4, a method 400 for forming an embedded passive device module is shown. The method 400 may include depositing an amount of alkali silicate material 402. The method 400 may also include co-depositing an amount of embedded passive device material with the amount of alkali silicate material 404. The method 400 may also include thermally processing the amount of alkali silicate material and the amount of embedded passive device material at a temperature sufficient to cure the amount of alkali silicate material and the amount of embedded passive device material and form a substantially moisture free substrate 406. The formed substrate may be deposited (e.g., printed) to be in electrical contact with one or more printed circuit board components (e.g., metal electrodes, etc.). The substrate may also be laminated over via a standard substrate lamination process. In additional embodiments, the method 400 may further include applying a second amount of alkali silicate material substantially onto the substrate 408. The method 400 may also include co-depositing a second amount of embedded passive device material with the second amount of alkali silicate material substantially onto the substrate to form a second layer 410. The method 400 may also include thermally processing the first layer and the second layer at a temperature sufficient to cure the first layer and the second layer and form a bonded multi-layer substrate. Thermally processing the first layer and the second layer may also include removing substantially all moisture from the first layer and the second layer. In some instances, the method 400 may further include aligning the first layer and the second layer to allow the first amount of embedded passive device material of the first layer and the second amount of embedded passive device material of the second layer to interact electronically (e.g., form a functioning embedded passive device).

Method 400 may also include combining at least one of the first layer or the second layer with at least one signal routing layer (e.g., a capacitive inner layer 206, copper signal trace, core material (e.g., alkali silicate core material FR-4 core material)) to form a stacked multilayer structure. In additional embodiments, (e.g., in the case of a resistor) conductive alkali silicate material may be utilized to maintain electrical conductivity. In some instances, a deposited layer of alkali silicate material may include embedded passive device material (e.g., suspended nano- or micro-particles) and be deposited as single liquid coating solution.

The alkali silicate material and the embedded passive device material may be applied via a micro-piezo deposit device including a plurality of nozzles separately loaded with at least one of the alkali silicate material or the embedded passive device material.

The method 400 may further include applying a third amount of alkali silicate material substantially onto the second layer and co-depositing a third amount of embedded passive device material with the third amount of alkali silicate material substantially onto the second layer to form a third layer. Method 400 may also include thermally processing the second layer and the third layer may also include removing substantially all moisture from the third layer. It is contemplated that the method 400 may co-deposit the alkali silicate material and nano- or micro-particle composites (suspensions) to achieve a high density of nano- or micro-particles embedded in the alkali silicate material and create any number of layers to achieve any desired substrate thickness.

Embedded passive device material may include any embedded passive device substance suitable for forming an embedded passive device or structure, including the embedded passive device materials described previously.

Method 400 may include applying the alkali silicate material to an electronic substrate to assist in thermal reduction or transfer. Further, method 400 may include providing a co-deposition of an alkali silicate material as a radiation resistant composite with ceramic or rare earth particles to increase radiation resistance or provide anti-tamper protection. Method 400 may also include providing a co-deposition of alkali silicate material and one or more optical structures (e.g., fluorescents, optical filters or dopants) for optical interconnect capabilities or functionality within an electronic substrate.

Method 400 may further provide coating of electronic structures on an electronic substrate with a layer of alkali silicate material. Coating may include coating of embedded passive device structures and/or surface functional coatings or structures.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An embedded passive device module of an electronic substrate, comprising:
    a first layer disposed on or over a layer of the electronic substrate comprising:
        a first amount of an alkali silicate material;
        a first amount of an embedded passive device material;
    a second layer, comprising:
        a second amount of an alkali silicate material; and
        a second amount of an embedded passive device material;
    wherein the second layer is aligned to the electronic substrate to allow the first and second amounts of the embedded passive device materials to interact electronically.

2. The device module of claim 1, further comprising:
    electrical contacts for the embedded passive electrical module; and
    an electrical interconnect layer in the electronic substrate configured to electrically couple the embedded passive electrical module to other electronic components coupled to the electronic substrate.

3. The device module of claim 2, wherein the electrical interconnect layer comprises a surface conductive layer to electrically couple the embedded passive electrical component to a semiconductor device disposed on a surface of the electronic substrate.

4. The device module of claim 1, wherein at least one of the first amount and the second amount of the alkali silicate materials comprises an alkali silicate composition including: a SiO2/M2O ratio of greater than or equal to about 2.5.

5. The device module of claim 1, wherein at least one of the first amount and the second amount of the embedded passive device materials comprises a nano- or micro-particle composition.

6. The device module of claim 1, wherein at least one of the first amount and the second amount of the embedded passive device materials comprises a nano- or micro-particle composition comprising at least one of a resistive material, a magnetic material, a capacitive material, and an inductor material.

7. The device module of claim 1, wherein the first amount of embedded passive device material comprises a nano- or micro-particle composition.

8. The device module of claim 1, wherein
    the first amount of the alkali silicate material and the first amount of the embedded passive device material are thermally cured, and
    the electronic substrate is substantially moisture free.

9. The device module of claim 1, further comprising an embedded passive electrical component on the electronic substrate comprising the embedded passive device material.

10. A printed circuit board, comprising the device module of claim 1.

11. The device module of claim 1, further comprising:
    at least one signal routing layer configured to couple electrically the embedded passive device module to another electrical component disposed in or on a printed circuit board;
    wherein the device module is a stacked multilayer structure.

* * * * *